(12) United States Patent
Joo

(10) Patent No.: US 8,891,311 B2
(45) Date of Patent: Nov. 18, 2014

(54) SEMICONDUCTOR MEMORY DEVICE AND METHOD OF PROGRAMMING THE SAME

(75) Inventor: Seok Jin Joo, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 415 days.

(21) Appl. No.: 13/306,047

(22) Filed: Nov. 29, 2011

(65) Prior Publication Data

US 2012/0134214 A1 May 31, 2012

(30) Foreign Application Priority Data

Nov. 30, 2010 (KR) ........................ 10-2010-0120634

(51) Int. Cl.
| | |
|---|---|
| G11C 11/34 | (2006.01) |
| G11C 16/04 | (2006.01) |
| G11C 11/56 | (2006.01) |

(52) U.S. Cl.
CPC ........ G11C 11/5628 (2013.01); *G11C 16/0483* (2013.01)
USPC ............. 365/185.19; 365/185.03; 365/185.22

(58) Field of Classification Search
CPC .... G11C 16/34; G11C 16/3468; G11C 5/141; G11C 5/143; G11C 16/10–16/24
USPC ............................ 365/185.01, 185.33, 185.19
See application file for complete search history.

(56) References Cited

U.S. PATENT DOCUMENTS

| | | | | |
|---|---|---|---|---|
| 2007/0030732 | A1* | 2/2007 | Micheloni et al. | ........ 365/185.03 |
| 2008/0094893 | A1* | 4/2008 | Choi | ........................ 365/185.03 |
| 2009/0285020 | A1* | 11/2009 | Park et al. | ................ 365/185.03 |
| 2009/0285023 | A1* | 11/2009 | Cho et al. | ................ 365/185.03 |
| 2010/0191931 | A1* | 7/2010 | Kim | .............................. 711/170 |

FOREIGN PATENT DOCUMENTS

| | | |
|---|---|---|
| KR | 100874920 | 12/2008 |
| KR | 100877104 | 1/2009 |
| KR | 1020100013963 | 2/2010 |
| KR | 1020100107294 | 10/2010 |

OTHER PUBLICATIONS

Office Action issued by the Korean Intellectual Property Office on Sep. 24, 2012.
Office Action issued from the Korean Intellectual Property Office on Feb. 16, 2012.

* cited by examiner

*Primary Examiner* — Son Dinh
*Assistant Examiner* — Uyen B Tran
(74) *Attorney, Agent, or Firm* — IP & T Group LLP

(57) ABSTRACT

A program method of a semiconductor memory device includes performing a least significant bit (LSB) program operation for target LSB program cells of a selected page, increasing the threshold voltages of target most significant bit (MSB) program cells of the selected page before performing an MSB operation for the target MSB program cells, and performing the MSB program operation for the target MSB program cells after the increasing of the threshold voltages of the target MSB program cells.

19 Claims, 5 Drawing Sheets

SEMICONDUCTOR MEMORY DEVICE AND METHOD OF PROGRAMMING THE SAME

CROSS-REFERENCE TO RELATED APPLICATION

Priority to Korean patent application number 10-2010-0120634 filed on Nov. 30, 2010, the entire disclosure of which is incorporated by reference herein, is claimed.

BACKGROUND

Exemplary embodiments relate to the program method of a semiconductor memory device and, more particularly, to a program method for minimizing interference between neighboring memory cells.

A semiconductor memory device includes a memory cell array for storing data. The memory cell array includes memory cell blocks each including a plurality of memory cells.

There are various methods of programming the memory cells. As an example, an incremental step pulse program (ISPP) method of supplying program voltages, gradually rising, to word lines in order to prevent the widening of a threshold voltage distribution has been used. The ISPP method is described below with reference to the drawings.

FIG. 1 is a circuit diagram showing a part of a memory cell block shown to illustrate a conventional program method.

Referring to FIG. 1, the memory cell block includes a plurality of strings ST. Each of the strings includes a drain select transistor DST, a plurality of memory cells F0 to Fn, and a source select transistor SST which are coupled in series. The drain of the drain select transistor DST is coupled to a bit line BL, and the source of the source select transistor SST is coupled to a common source line CSL. The plurality of memory cells F0 to Fn are coupled in series between the drain select transistor DST and the source select transistor SST. The gates of the drain select transistors DST included in different strings are interconnected to form a drain select line DSL. The gates of the memory cells F0 to Fn included in different strings are interconnected to a plurality of word lines WL0 to WLn. The gates of the source select transistors SST included in different strings are interconnected to a source select line SSL.

A program operation is performed on a page by page basis. Here, the page refers to a group of memory cells coupled to the same word line. When the program operation is started, bit lines BL coupled to memory cells to be programmed are discharged, and the remaining bit lines are precharged. A program voltage is supplied to a word line coupled to a selected page PG, and a program pass voltage is supplied to the remaining word lines. Next, when the drain select transistors DST are turned on, the memory cells to be programmed among the memory cells included in the selected page are programmed according to voltages of the bit lines BL.

In the ISPP method, after selected memory cells are programmed by supplying a program voltage to a selected word line, a verify operation for verifying whether the threshold voltages of the selected memory cells have reached a target level is performed. If there are memory cells having the threshold voltages that have not reached the target level as a result of the verify operation, the program voltage is increased by a step voltage, and the selected memory cells are programmed by increasing the program voltage to the selected word line. Likewise, the program operation is performed while gradually increasing the program voltage until the threshold voltages of all of the selected memory cells reach the target level.

After the program operation for the selected page is completed, a next page is selected and the program operation for the next page is performed. Meanwhile, when the program operation for the selected page is performed, the memory cells, included in an adjacent page, may be subjected to interference. In other words, the threshold voltages of memory cells adjacent to selected memory cells may rise because of interference generated by a high program voltage supplied to a selected word line when the program operation for a selected page is performed. The influence of interference is greater in a multi-level cell (MLC), programmed in various levels, than in a single level cell (SLC).

The influence of interference is described in detail with reference to the following drawing.

FIG. 2 is a graph illustrating threshold voltage distributions shown to illustrate features of a conventional program method.

For example, an MLC that may be programmed with three program states according to the level of a threshold voltage is described below with reference to FIG. 2. In FIG. 2, a threshold voltage graph 10 indicated by a dotted line denotes a threshold voltage distribution before the influence of interference, and a threshold voltage graph 20 indicated by a solid line denotes a threshold voltage distribution after the influence of interference. A margin for distinguishing the states from each other exists between the different threshold voltage distributions 10 and 30. In a read operation, data stored in memory cells to be read can be read by using a read voltage R1, R2, or R3 corresponding to each of the margin section.

For example, if interference is not generated (10), when data stored in selected memory cells are read by using the read level R1, the selected memory cells are read as having been programmed. When the data stored in the selected memory cells are read by using the read level R2, the selected memory cells are read as not having been programmed. Consequently, the threshold voltages of the selected memory cells are determined to be distributed between the read level R1 and the read level R2, and thus the data of the selected memory cells is read as data that is within a corresponding margin.

If the threshold voltages of programmed memory cells become higher than the read level R2 due to interference, when the data of selected memory cells is read by using the read level R2, the selected memory cells with the threshold voltage distribution 10 are changed to have the threshold voltage distribution 20, and thus data different from data before interference is generated may be read.

Furthermore, the interference phenomenon may also vary according an interval between neighboring memory cells.

FIG. 3 is a graph illustrating interference due to an interval between memory cells.

In the graph of FIG. 3, the X axis indicates an interval between gates (that is, an interval between memory cells), and the Y axis indicates the coupling ratio due to interference. From the graph, it can be seen that the influence of interference is greater in a silicon nitride layer than in a silicon oxide under the same interval condition. It can also be seen that the coupling ratio due to interference under the same material condition gradually increases in response to a reduction in the interval and the interference sharply increases at intervals smaller than the interval of 40 nm. It can also be seen that the height of the floating gate of the memory cell is proportional to the interference.

As described above, there are several factors to influence interference. If interference is generated, the level of reliability of a program operation and a read operation is degraded.

BRIEF SUMMARY

According to an exemplary embodiment, interference between neighboring memory cells is reduced in a most significant bit (MSB) program operation for memory cells by increasing the threshold voltages of memory cells to be programmed among memory cells having an erase state to a specific level after a least significant bit (LSB) program operation.

A program method of a semiconductor memory device according to an aspect of the present disclosure includes performing a least significant bit (LSB) program operation for target LSB program cells of a selected page, increasing the threshold voltages of target most significant bit (MSB) program cells of the selected page before performing an MSB operation for the target MSB program cells, and performing the MSB program operation for the target MSB program cells after the increasing of the threshold voltages of the target MSB program cells.

A program method of a semiconductor memory device according to another aspect of this disclosure includes performing a least significant bit (LSB) program operation for target LSB program cells of a first page; increasing the threshold voltages of target most significant bit (MSB) program cells of the first page; performing an LSB program operation for target LSB program cells of a second page adjacent to the first page; increasing the threshold voltages of target MSB program cells of the second page; performing an MSB program operation for target MSB program cells for the first page; and performing an MSB program operation for target MSB program cells for the second page.

A semiconductor memory device comprises a memory cell array including a plurality of memory cells; a circuit group configured to perform a program operation, a read operation, or an erase operation for the memory cells; and a controller configured to control the circuit group in order to perform a least significant bit (LSB) program operation for target LSB program cells of a selected page and increase threshold voltages of target most significant bit (MSB) program cells of the selected page before performing an MSB operation for the target MSB program cells.

DESCRIPTION OF EMBODIMENTS

Hereinafter, exemplary embodiments of the present disclosure will be described in detail with reference to the accompanying drawings. The figures are provided to allow those having ordinary skill in the art to understand the scope of the embodiments of the disclosure.

Figure 1:
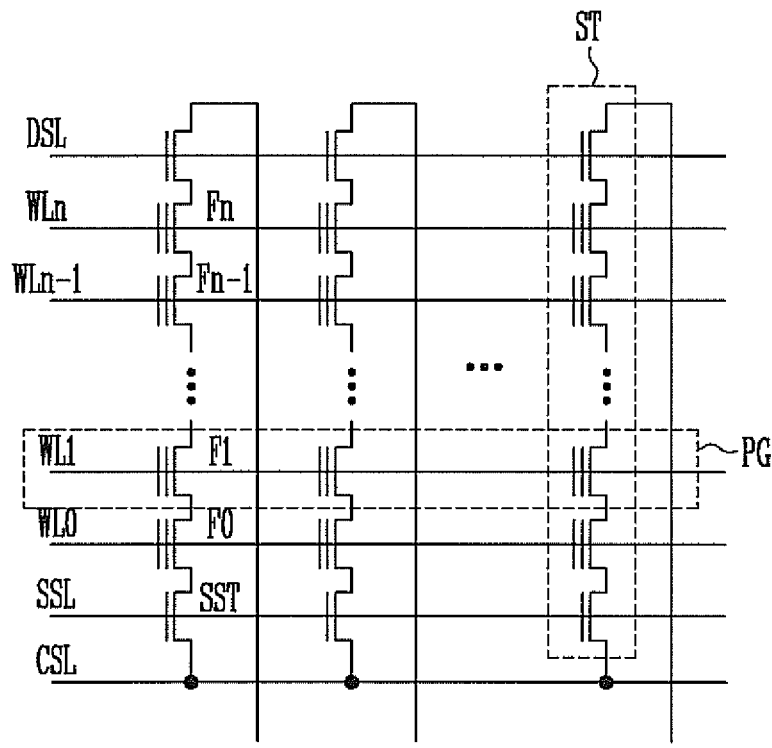
FIG. 1 is a circuit diagram showing a part of a memory cell block shown to illustrate a conventional program method.
Figure 2:
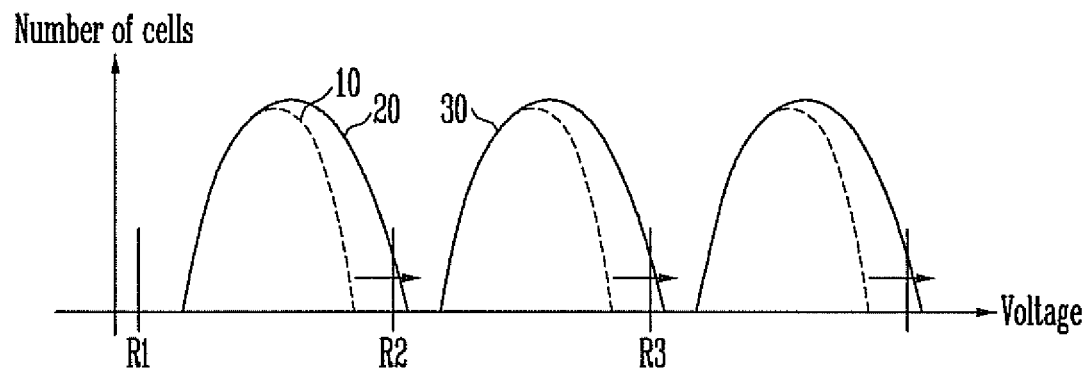
FIG. 2 is a graph illustrating threshold voltage distributions shown to illustrate features of a conventional program method.
Figure 3:
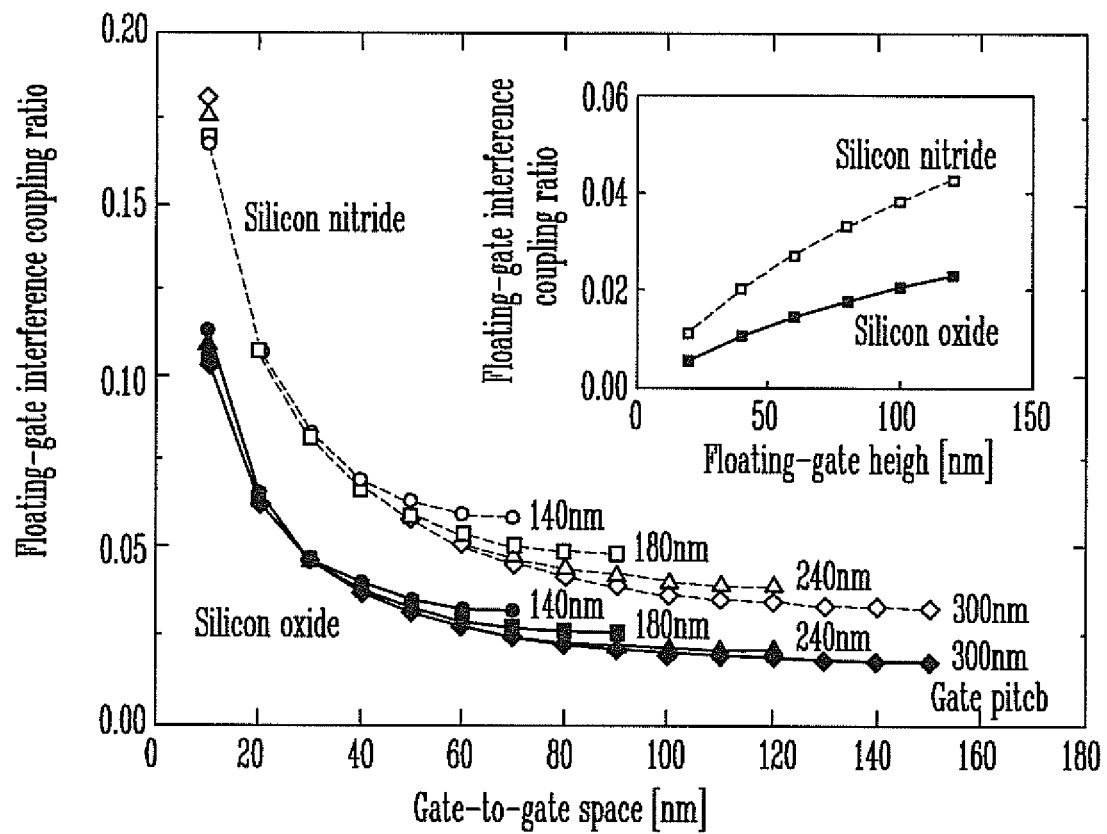
FIG. 3 is a graph illustrating interference due to an interval between memory cells.
Figure 4:
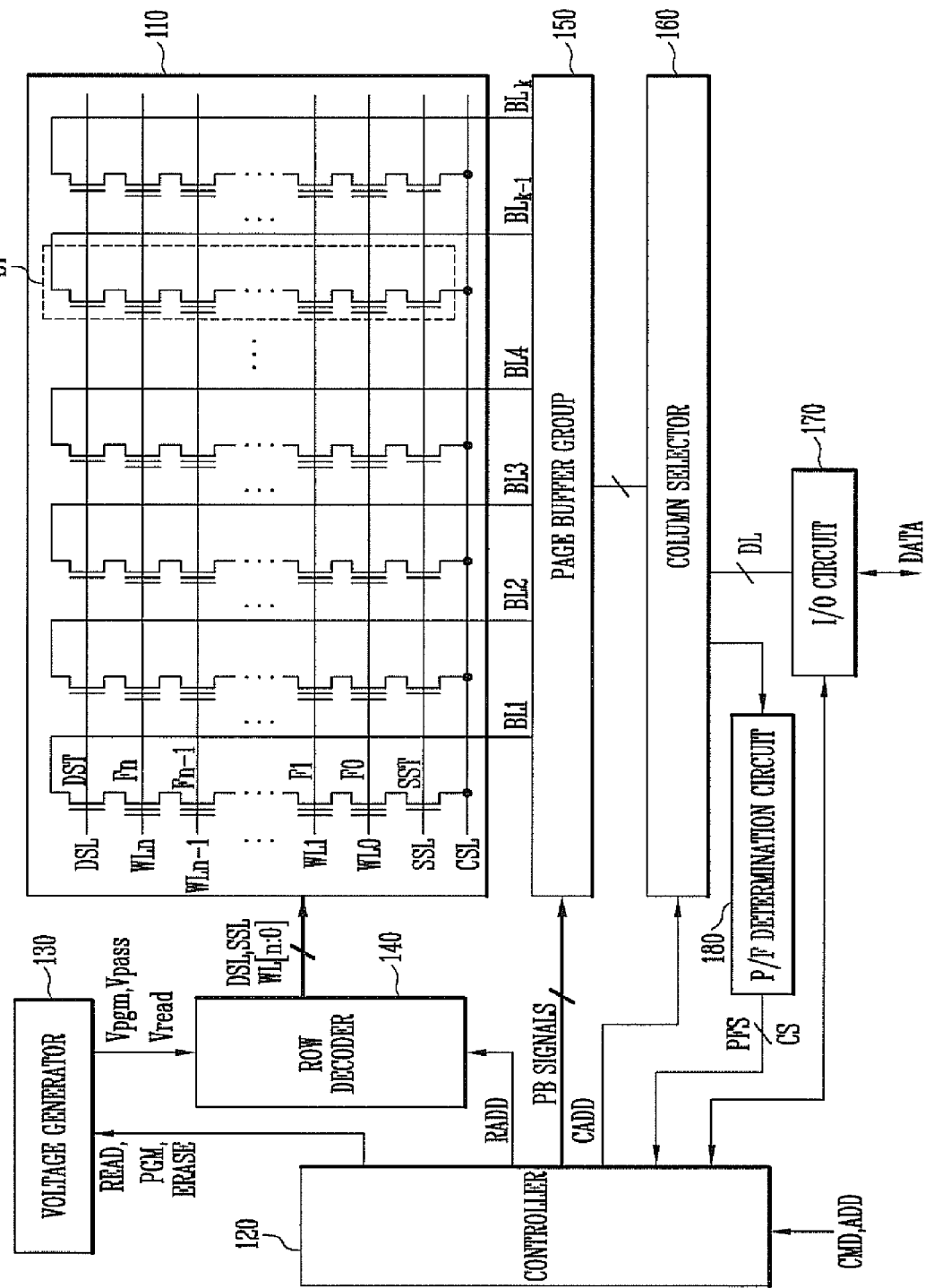
FIG. 4 is a block diagram of a semiconductor memory device illustrating a program method of this disclosure.

FIG. 4 is a block diagram of a semiconductor memory device illustrating a program method of this disclosure.

Referring to FIG. 4, the semiconductor memory device according to the embodiment of this disclosure includes a memory cell array 110, a circuit group (130, 140, 150, 160, 170, and 180) configured to perform a program operation or a read operation for memory cells included in the memory cell array 110, and a controller 120 configured to control the circuit group (130, 140, 150, 160, 170, and 180) in order to perform a least significant bit (LSB) program operation for target LSB program cells of a selected page and increase threshold voltages of target most significant bit (MSB) program cells of the selected page before performing an MSB operation for the target MSB program cells.

In the case of a NAND flash memory device, the circuit group includes a voltage generator 130, a row decoder 140, a page buffer group 150, a column selector 160, an I/O circuit 170, and a pass/fail (P/F) determination circuit 180.

The memory cell array 110 includes a plurality of memory cell blocks, even though only one of the memory cell blocks is shown in FIG. 4. Each of the memory cell blocks includes a plurality of strings ST. Some of the strings ST are designated as normal strings, and some of the strings ST are designated as flag strings. The strings ST have the same configuration. Each of the strings ST includes a source select transistor SST coupled to a common source line CSL, a plurality of memory cells F0 to Fn, and a drain select transistor DST coupled to a bit line BL1. Memory cells included in the flag string are called flag cells, but have the same configuration as the normal memory cells. The gate of the source select transistor SST is coupled to a source select line SSL, the gates of the memory cells F0 to Fn are coupled to respective word lines WL0 to WLn, and the gate of the drain select transistor DST is coupled to a drain select line DSL. The strings ST are coupled to the respective bit lines BL1 to BLk and are in common coupled to the common source line CSL. A group of memory cells coupled to the same word line among memory cells included in different strings ST is called a page.

The controller 120 internally generates a program operation signal PGM, a read operation signal READ, or an erase operation signal ERASE in response to a command signal CMD and generates control signals PB SIGNALS for controlling the page buffers of the page buffer group 150 according to different operations. The controller 120 also internally generates a row address signal RADD and a column address signal CADD in response to an address signal ADD. Furthermore, the controller 120 checks whether the threshold voltages of selected memory cells have risen to a target level based on a check signal CS generated by the P/F determination circuit 180 at the time of a program verify operation and determines whether to perform a program operation again or finish the program operation according to a result of the check.

The voltage supply circuit (130 and 140) supplies operating voltages to perform a program operation, an erase operation, or a read operation for memory cells to the drain select line DSL, the word lines WL0 to WLn, and the source select line SSL of a selected memory cell block in response to the signals READ, PGM, ERASE, and RADD of the controller 120. The voltage supply circuit includes the voltage generator 130 and the row decoder 140.

The voltage generator 130 outputs operating voltages for programming, reading, or erasing memory cells to global lines in response to the operation signals PGM, READ, and ERASE (that is, the internal command signals of the controller 120) and outputs operating voltages (for example, Vpgm, Vpass, and Vread) for a program to the global lines when memory cells are programmed.

The row decoder 140 transfers the operating voltages of the voltage generator 130 to the local lines DSL, WL [n:0], and SSL of a selected memory cell block in response to the row address signals RADD of the controller 120.

The page buffer group 150 includes page buffers (not shown) coupled to the respective bit lines BL1 to BLk. The page buffer group 150 supplies voltages to store data in the memory cells F0 to Fn to the respective bit lines BL1 to BLk, in response to the control signals PB SIGNALS of the controller 120. The page buffer group 150 precharges the bit lines BL1 to BLk when the program operation, the erase operation, or the read operation for the memory cells F0 to Fn is performed or latches data, corresponding to threshold voltages of the memory cells F0 to Fn which are detected according to a change in voltages of the bit lines BL1 to BLk.

In other words, the page buffer group 150 supplies a program enabling voltage (for example, 0 V) or a program inhibition voltage (for example, Vcc) to the bit lines BL according to data stored in their latches at the time of a program operation. The page buffer group 150 detects data stored in the memory cells F0 to Fn by controlling the voltages of the bit lines BL1 to BLk according to data stored in the memory cells F0 to Fn at the time of a read operation.

The column selector 160 selects the page buffers of the page buffer group 150 in response to the column address signal CADD of the controller 120. Data latched in page buffers selected by the column selector 160 is outputted.

The I/O circuit 170 transfers external data to the column selector 160 under the control of the controller 120 in order to input the external data to the page buffer group 150 at the time of a program operation. When the column selector 160 sequentially transfers the external data to the page buffers of the page buffer group 150, the page buffers stores the external data in their latches. Furthermore, at the time of a read operation, the I/O circuit 170 externally outputs data received from the page buffers of the page buffer group 150 via the column selector 160.

The P/F determination circuit 180 checks whether there is an error cell having a threshold voltage lower than a target level among programmed memory cells in a program verify operation performed after a program operation and outputs a result of the check in the form of a check signal PFS. The P/F determination circuit 180 counts the number of error cells and outputs a result of the count in the form of the check signal CS.

The controller 120 controls a program voltage supplied to a selected word line when a program operation for selected memory cells is performed and also controls the voltage generator 130 so that verify voltages can be selectively supplied to the selected word line at the time of a program verify operation. In some embodiments, the controller 120 may control the voltage generator 130 in response to the check signal CS of the P/F determination circuit 180.

FIGS. 5A to 5I are graphs illustrating threshold voltage distributions shown to illustrate a program method of this disclosure.

Figure 5A:
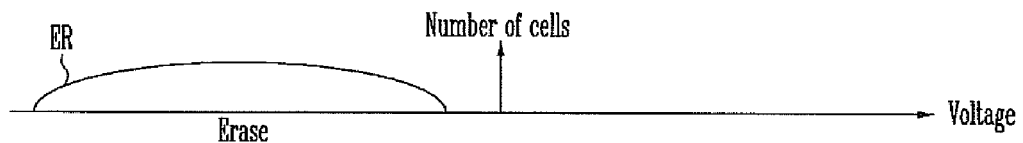
FIGS. 5A to 5I are graphs illustrating threshold voltage distributions shown to illustrate a program method of this disclosure.

Referring to FIG. 5A, when a program operation is started, data stored in all of the memory cells of a selected memory cell block are erased. Thus, the threshold voltages of all of the memory cells have an erase state ER lower than 0 V.

Figure 5B:
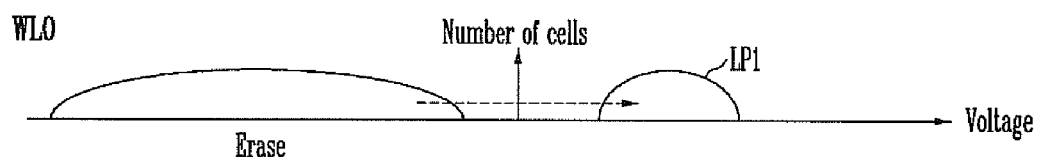

Referring to FIG. 5B, an LSB program operation is performed for first memory cells selected from a first page selected from the selected memory cell block. Here, the page refers to the unit of memory cells coupled to the same word line. For example, a group of the memory cells coupled to the $0^{th}$ word line WL0 is called the first page, a group of the memory cells coupled to the first word line WL1 is called a second page, and a group of the memory cells coupled to the second word line WL2 is called a third page. The memory cells are programmed with a first state MPV1, a second state MPV2 higher than the first state MPV1, and a third state MPV3 higher than the second state MPV2 according to levels of their threshold voltages.

The LSB program operation is performed to increase the levels of the threshold voltages of selected memory cells to be programmed with the second state MPV2 or the third state MPV3. More particularly, data to be stored in the selected memory cells is received via the I/O circuit 170. The received data is sequentially transferred to the page buffer group 150 via the column selector 160. A program enabling voltage (for example, 0 V) is supplied to selected bit lines coupled to the selected memory cells, and a program inhibition voltage (for example, Vcc) is supplied to the remaining bit lines according to the data stored in the page buffer group 150. LSB data is first inputted to the page buffer group 150, and the LSB program operation is performed according to the inputted data.

In this case, the LSB program operation is performed by turning on the drain select transistors DST of the selected memory cells and supplying program voltages to a selected word line coupled to the selected bit lines and the pass voltage to the remaining word lines. While the LSB program operation is performed, the source select transistors SST are turned off. The LSB program operation is performed by using an ISPP method of supplying the selected word line with the program voltages that gradually increase.

More particularly, the threshold voltages of the selected memory cells are increased by supplying the progressively increasing program voltage to the selected word line until the threshold voltages of the selected memory cells reach a target level. Next, a verify operation for verifying whether the threshold voltages of the selected memory cells have reached the target level. When the program voltage is supplied to the selected word line, a program pass voltage is supplied to the remaining word lines. If, as a result of the verify operation, there are memory cells having the threshold voltages that have not reached the target level, the program operation is repeatedly performed again by progressively increasing the program voltage by a specific level at each step. Here, the program voltage having the lowest level among the program voltages that are supplied to the selected word line is called a program start voltage.

When the LSB program operation is performed for the first memory cells of the first page as described above, the threshold voltages of the first memory cells can be increased (LP1).

Figure 5C:
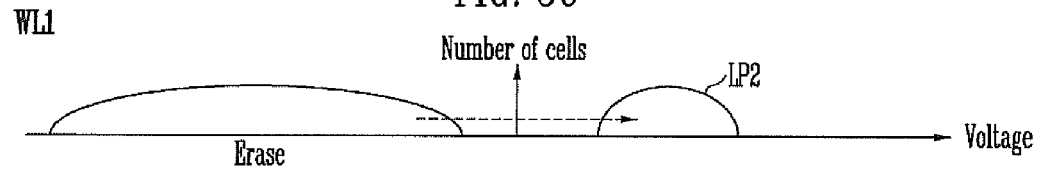

Referring to FIG. 5C, the threshold voltages of the second memory cells are increased by performing the LSB program operation for the second memory cells of the second page adjacent to the first page (LP2). The LSB program operation for the second page is performed like the LSB program operation for the first page.

Figure 5D:
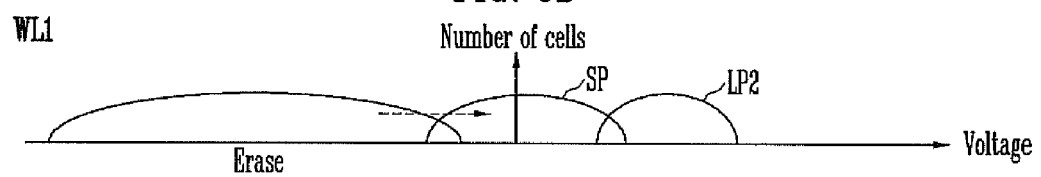
Figure 5E:
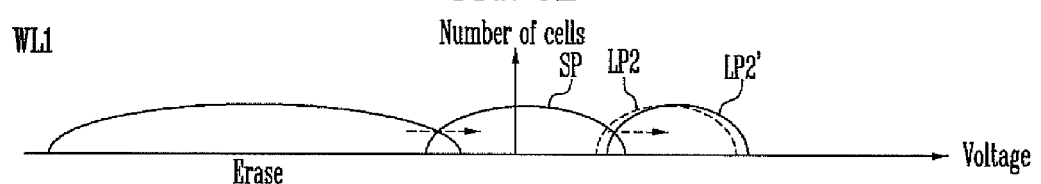

Referring to FIGS. 5D and 5E, the threshold voltages of selected memory cells for which an MSB program operation will be performed are increased. In order to increase the threshold voltages of the selected memory cells, a slight program operation is performed. The slight program operation may be performed in accordance with the following methods.

A slight program operation according to a first embodiment of this disclosure is performed as follows.

Referring to FIG. 5D, in order to increase the threshold voltages of the selected memory cells for which the MSB program operation will be performed from among memory cells of an erase state Erase in the second page (that is, memory cells for which the LSB program operation has not been performed), the program voltage is supplied to the first word line WL1 coupled to the second page.

More particularly, a program enabling voltage 0 V is supplied to selected bit lines BL coupled to the selected memory cells of the second page for which the slight program operation will be performed, and a program inhibition voltage Vcc is supplied to the remaining bit lines. Next, the drain select transistors DST of the selected memory cells are turned on, a slight program voltage is supplied to the first word line WL1 coupled to the second page, and a slight program pass voltage is supplied to the remaining word lines. Here, the slight program voltage is less than program voltages used for performing the MSB program operation. According to an example, the slight program pass voltage is the same level as the pass voltage of the LSB program operation. The slight program voltage is set to a low level so that the threshold voltages of the selected memory cells do not reach the verify level of the first state (MPV1 in FIG. 5F). The slight program voltage may be set to the same level as the program start voltage of the LSB program operation. Furthermore, the slight program operation may be performed according to an ISPP method or may be performed without a verify operation (that is, by supplying a single program voltage without performing a verification and repeating the program voltage application). If the verify operation is omitted, the slight program operation may be completed by supplying a single slight program voltage (or pulse) to a selected word line (that is, the first word line WL1 coupled to the second page).

If the verify operation is omitted at the time of the slight program operation, the threshold voltages of selected memory cells can be increased by supplying a single slight program voltage and the time taken to perform the entire program can be reduced. If the slight program operation is performed as described above, the threshold voltages of the selected memory cells can be increased (SP). In FIG. 5D, while the threshold voltages SP of the memory cells for which the slight program operation has been performed are illustrated to be distributed across 0 V, the threshold voltage distribution of the selected memory cells may be controlled to be on any one side of the threshold voltage of 0 V by appropriately controlling a level of the slight program voltage. This may be controlled by setting the program voltage at the time of the slight program operation.

A slight program operation according to a second embodiment of this disclosure is performed as follows.

Referring to FIG. 5E, the slight program operation is performed so as to increase the threshold voltages of selected memory cells for which an MSB program operation will be performed from among the memory cells of the second page. That is, the memory cells for which the slight program operation will be performed include the selected memory cells for which the MSB program operation will be performed from among memory cells of an erase state Erase for the second page, and the memory cells LP2 for which the LSB program operation has been performed.

In order to increase the threshold voltages of the selected memory cells, a program enabling voltage 0 V is supplied to selected bit lines BL coupled to the selected memory cells, and a program inhibition voltage Vcc is supplied to the remaining bit lines. The drain select transistors DST coupled to the selected bit lines BL are turned on, a slight program voltage is supplied to a word line coupled to the selected memory cells (that is, the first word line WL1 coupled to the second page), and a slight program pass voltage is supplied to the remaining word lines coupled to the remaining pages.

Here, the slight program pass voltage and the slight program voltage are set to be identical with those in the first embodiment of this disclosure. Furthermore, as in the first embodiment of this disclosure, a slight program verify operation may be performed or omitted. Accordingly, the threshold voltages of some of the memory cells having the erase state Erase are increased (SP), and the threshold voltages of all of the memory cells LP2 for which the LSB program operation has been performed are increased (LP2'). Furthermore, the sequence of the slight program operations for the memory cells for which the MSB program operation will be performed and for the memory cells LP2 for which the LSB program operation has been performed may be changed, or the slight program operations may be performed at the same time.

A slight program operation according to a third embodiment of this disclosure is performed as follows.

Referring to FIG. 5E, the slight program operation is performed so as to increase the threshold voltages of selected memory cells for which an MSB program operation will be performed from among the memory cells of the second page. In particular, in this embodiment, the selected memory cells for which the MSB program operation will be performed for memory cells of an erase state Erase in the memory cells of the second page and for the memory cells LP2 to which the LSB program operation has been performed become memory cells for which the slight program operation will be performed.

In order to increase the threshold voltages of the selected memory cells, a program enabling voltage 0 V is supplied to selected bit lines coupled to the selected memory cells, and a program inhibition voltage Vcc is supplied to the remaining bit lines. The drain select transistors DST coupled to the selected bit lines are turned on, a slight program voltage is supplied to a word line coupled to the selected memory cells (that is, the first word line WL1 coupled to the second page), and a slight program pass voltage is supplied to the remaining word lines coupled to the remaining pages.

Here, the slight program pass voltage and the slight program voltage are set to be identical with those in the first embodiment. Furthermore, as in the first embodiment, a slight program verify operation may be performed or omitted. Thus, the threshold voltages of some of the memory cells having the erase state Erase are increased (SP), and the threshold voltages of some of the memory cells LP2 for which the LSB program operation has been performed are increased (LP2'). More particularly, the threshold voltages of memory cells to be programmed with first and third states (MPV1 and MPV3 in FIG. 5G) are increased, and the threshold voltages of memory cells to be programmed with a second state (MPV2 in FIG. 5G) remain intact (LP2).

In the second and the third embodiments, the operation for increasing (LP2') the threshold voltages of the memory cells for which the LSB program operation has been performed may be performed when the slight program operation SP is performed for the memory cells subject to the MSB program operation is being performed or may be performed before or after the slight program operation SP is performed for the memory cells subject to the MSB program operation has been performed. Here, after performing the memory cells subject to the MSB program, the MSB program is performed.

Figure 5F:
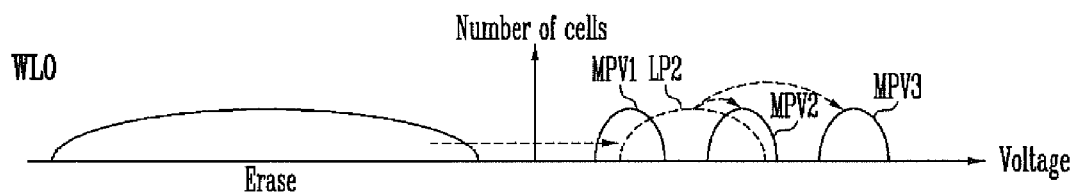

Referring to FIG. 5F, an MSB program operation is performed for memory cells selected from the memory cells of the first page. More particularly, memory cells, selected from the memory cells of the first page for which the LSB program operation has not been performed, are programmed to have the first state MPV1 or memory cells selected from the memory cells LP1 for which the LSB program operation has been performed are programmed to have the second state MPV2 (higher than the first state MPV1) or the third state MPV3 (higher than the first state MPV2), by increasing the threshold voltages of the selected memory cells.

If the selected memory cells are memory cells for which the LSB program operation has been performed as described with reference to FIG. 5D, the time taken to perform the MSB program operation can be reduced because the threshold voltages of the selected memory cells are increased by a smaller voltage level. The MSB program operation may be performed like the LSB program operation except that, for example, only the verify level is high. For example, the MSB program operation may be performed according to an ISPP method of progressively increasing the program voltage supplied to the first word line WL0 at each program voltage repetition step. When the MSB program operation for the first page is finished, all of the program operations for the first page is completed.

Figure 5G:
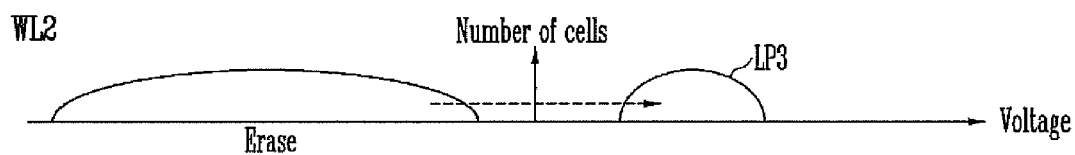

Referring to FIG. 5G, the threshold voltages of third memory cells are increased by performing an LSB program operation for the second memory cells of the third page adjacent to the second page (LP3). The LSB program operation for the third page is performed like the LSB program operation for the first or second page.

Figure 5H:
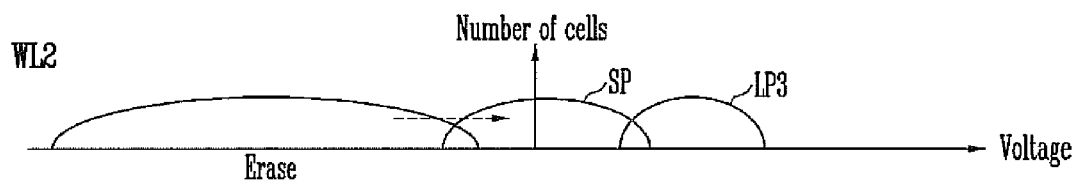

As described with reference to FIGS. 5H, 5D, and 5E, the threshold voltages of memory cells for which an MSB program operation will be performed from among the memory cells of the third page are increased by performing a slight program operation.

Figure 5I:
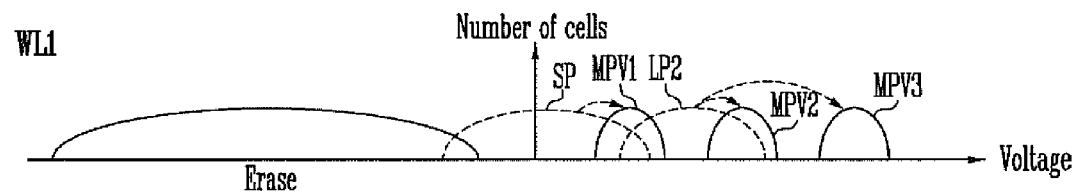

Referring to FIG. 5I, the MSB program operation is performed for memory cells selected from the memory cells of the second page. More particularly, the threshold voltages of the memory cells for which the slight program operation has been performed from among the memory cells of the second page are increased to become the first state MPV1 or memory cells selected from among the memory cells LP2 and LP2' for which the LSB program operation has been performed are increased to become the second state MPV2 or the third state MPV3 by performing the MSB program operation so that the program operation for the second page is completed.

Next, a program operation for the selected memory cell block is performed in such a manner that a program operation for the third page is completed by performing an LSB program operation for a fourth page adjacent to the third page and then performing an MSB program operation for the third page.

As described above, interference is significant in a program operation for making memory cells of the erase state (that is, memory cells for which an LSB program operation has not been performed) to have the first state. If the slight program operation is performed as in this disclosure, however, the width of a change in the threshold voltages of selected memory cells can be reduced in an MSB program operation because the threshold voltages of memory cells for which the MSB program operation will be performed from among the memory cells of the second page (refer to FIGS. 5D and 5E), have been increased by an appropriate voltage level. Consequently, the threshold voltages of memory cells included in a page (that is, the first page) for which a program operation has been completed can be prohibited from rising due to interference, and an adequate level of reliability in a read operation can be obtained.

Furthermore, the program operation of this disclosure has been described in connection with an MLC programmed with the 3 program states, but may also be applied to a triple level cell (TLC) programmed with 7 program states or a cell programmed to have 8 or higher program states.

According to this disclosure, interference between neighboring memory cells can be reduced at the time of a program operation, and the level of reliability in a program operation and a read operation can be improved.

What is claimed is:

1. A program method of a semiconductor memory device, comprising:
   performing a least significant bit (LSB) program operation for target LSB program cells of a selected page;
   increasing threshold voltages of target most significant bit (MSB) program cells of the selected page by supplying a single slight program voltage to a word line coupled to the selected page without performing a verify operation before performing an MSB operation for the target MSB program cells of the selected page; and
   performing the MSB program operation for the target MSB program cells of the selected page after the increasing the threshold voltages of the target MSB program cells of the selected page.

2. The program method of claim 1, wherein the LSB and MSB program operations are each performed by performing a program operation with a program voltage and repeatedly performing the program operation after increasing the program voltage by a step voltage each time until each of threshold voltages of selected memory cells reaches a target threshold voltage level.

3. The program method of claim 1, wherein the target MSB program cells comprise the target LSB program cells, memory cells selected from among memory cells different from the target LSB program cells, or the target LSB program cells and the memory cells selected from among memory cells different from the target LSB program cell.

4. The program method of claim 1, wherein increasing the threshold voltages of the target MSB program cells of the selected page is performed according to a slight program operation using the single slight program voltage.

5. The program method of claim 4, wherein during the slight program operation, a slight program pass voltage is supplied to other word lines.

6. The program method of claim 5, wherein the single slight program voltage is less than a program voltage used for performing the MSB program operation, and the slight program pass voltage is the same level as the pass voltage of the LSB program operation.

7. The program method of claim 4, wherein the slight program operation is performed for target MSB program cells from among memory cells of an erase state in the selected page, after the LSB program operation is performed, or is performed for target MSB program cells from among memory cells of an erase state in the selected page and the target LSB program cells of the selected page for which the LSB program operation has been performed.

8. The program method of claim 7,
   wherein when the slight program operation is performed for the target LSB program cells of the selected page for which the LSB program operation has been performed, threshold voltages of the target LSB program cells of the selected page for which the LSB program operation has been performed are increase, or threshold voltages of memory cells having a relatively high target level, from among the target LSB program cells of the selected page for which the LSB program operation has been performed, are selectively increased.

9. A program method of a semiconductor memory device, comprising:

performing a least significant bit (LSB) program operation for target LSB program cells of a first page;

increasing threshold voltages of target most significant bit (MSB) program cells of the first page;

performing an LSB program operation for target LSB program cells of a second page adjacent to the first page after increasing the threshold voltages of the target MSB program cells of the first page;

increasing threshold voltages of target MSB program cells of the second page;

performing an MSB program operation for target MSB program cells for the first page after increasing the threshold voltages of the target MSB program cells of the second page; and performing an MSB program operation for target MSB program cells for the second page.

10. The program method of claim 9, wherein the target MSB program cells of the first and second pages comprise the target LSB program cells of each page, memory cells selected from among memory cells different from the target LSB program cells of the each page, or the target LSB program cells and the memory cells selected from among memory cells different from the target LSB program cells of the each page.

11. The program method of claim 9, wherein the increasing the threshold voltages of the target MSB program cells of each of the first and second pages is performed by supplying a slight program voltage to a word line coupled to the first or second page and by supplying a slight program pass voltage to word lines coupled to other pages.

12. The program method of claim 11, wherein the slight program voltage is less than a program voltage used for performing the MSB program operation, and the slight program pass voltage is the same level as the pass voltage of the LSB program operation.

13. The program method of claim 9, wherein the increasing the threshold voltages of the target MSB program cells of each of the first and second pages is performed according to an incremental step pulse program (ISPP) method with performing a verify operation or is performed by supplying a slight program voltage to a selected word line without performing the verify operation for the increased threshold voltages.

14. The program method of claim 9, wherein the increasing the threshold voltages of the target MSB program cells of the respective pages is performed for the target MSB program cells of the respective pages or for the target MSB program cells of the respective pages and the LSB program cells of the respective pages after performing the LSB program operation of the respective pages.

15. The program method of claim 9, wherein, when the increasing the threshold voltages of the target LSB program cells of the respective pages is performed, threshold voltages of the memory cells of the respective pages for which the LSB program operation has been performed are increased, or threshold voltages of memory cells having a relatively high target level, from among the memory cells of the respective pages for which the LSB program operation has been performed, are selectively increased.

16. The program method of claim 9, further comprises performing a LSB program operation for target LSB program cells of a third page adjacent to the second page after performing the MSB program operation for target MSB program cells for the first page; and increasing threshold voltages of MSB program cells of the third page.

17. The program method of claim 16, further comprises performing an MSB program operation for target MSB program cells for the third page after performing the MSB program operation for target MSB program cells for the second page.

18. A semiconductor memory device, comprising:
a memory cell array including a plurality of memory cells;
a circuit group configured to perform a program operation, a read operation, or an erase operation for the memory cells; and
a controller configured to control the circuit group in order to perform a least significant bit (LSB) program operation for target LSB program cells of a selected page and increase threshold voltages of target most significant bit (MSB) program cells of the selected page before performing an MSB operation for the target MSB program cells by supplying a single slight program voltage to a word line coupled to the selected page without performing a verify operation.

19. The semiconductor memory device of claim 18, wherein the single slight program voltage is less than a program voltage used for performing the MSB program operation.

* * * * *